(12) United States Patent
Cardona, Jr.

(10) Patent No.: US 12,532,411 B2
(45) Date of Patent: Jan. 20, 2026

(54) 3D GLASS MODULES

(71) Applicant: ELECTRONIC DESIGN & DEVELOPMENT, CORP., Tucson, AZ (US)

(72) Inventor: Sergio E. Cardona, Jr., Tucson, AZ (US)

(73) Assignee: ELECTRONIC DESIGN & DEVELOPMENT, CORP., Tucson, AZ (US)

( * ) Notice: Subject to any disclaimer, the term of this patent is extended or adjusted under 35 U.S.C. 154(b) by 244 days.

(21) Appl. No.: 18/534,276

(22) Filed: Dec. 8, 2023

(65) Prior Publication Data

US 2024/0114617 A1    Apr. 4, 2024

Related U.S. Application Data

(63) Continuation-in-part of application No. 18/337,725, filed on Jun. 20, 2023, now abandoned.

(60) Provisional application No. 63/353,720, filed on Jun. 20, 2022.

(51) Int. Cl.
*H05K 1/02* (2006.01)
*H05K 1/03* (2006.01)
*H05K 1/11* (2006.01)

(52) U.S. Cl.
CPC ......... *H05K 1/0284* (2013.01); *H05K 1/0237* (2013.01); *H05K 1/0306* (2013.01); *H05K 1/115* (2013.01); *H05K 2201/10098* (2013.01)

(58) Field of Classification Search
CPC .... H05K 1/0284; H05K 1/0306; H05K 1/115; H05K 2201/10098
See application file for complete search history.

(56) References Cited

U.S. PATENT DOCUMENTS

| | | | |
|---|---|---|---|
| 4,122,406 | A | 10/1978 | Salzberg |
| 10,418,679 | B2 | 9/2019 | Parekh et al. |
| 2003/0003881 | A1 | 1/2003 | Anim-Appiah et al. |
| 2003/0146872 | A1 | 8/2003 | Kellerman et al. |
| 2006/0103576 | A1 | 5/2006 | Mahmoud et al. |

(Continued)

FOREIGN PATENT DOCUMENTS

| | | |
|---|---|---|
| WO | 2018051238 A1 | 3/2018 |
| WO | 2019221920 A1 | 11/2019 |

OTHER PUBLICATIONS

Hui et al. "Numerical and experimental studies of a helical antenna loaded by a dielectric resonator." Radio Science 32.2 (1997): 295-304.

(Continued)

*Primary Examiner* — Sherman Ng
(74) *Attorney, Agent, or Firm* — NGUYEN TARBET IP LAW

(57) ABSTRACT

A hermetic glass module for wireless communication. The module may comprise a plurality of glass layers comprising a first layer having capacitors, inductors, and resonators, a second layer comprising capacitors, inductors, diplexers, and waveguides, a third layer comprising microchips, and capacitors, and a fourth layer comprising a glass cover layer, and antennas disposed within the glass cover layer. The plurality of glass layers may each be separated by a substrate of a plurality of substrates and are connected by a redistribution layer (RDL) of a plurality of RDLs.

14 Claims, 9 Drawing Sheets

(56) References Cited

U.S. PATENT DOCUMENTS

| | | |
|---|---|---|
| 2009/0278759 A1 | 11/2009 | Moon et al. |
| 2011/0001680 A1 | 1/2011 | Leisten |
| 2011/0281603 A1 | 11/2011 | Lastinger et al. |
| 2012/0092089 A1 | 4/2012 | Zhu et al. |
| 2012/0188142 A1 | 7/2012 | Shashi et al. |
| 2012/0287018 A1 | 11/2012 | Parsche |
| 2013/0214871 A1 | 8/2013 | Nakamura et al. |
| 2015/0048996 A1 | 2/2015 | Aubert et al. |
| 2016/0029225 A1 | 1/2016 | Hu |
| 2016/0359539 A1 | 12/2016 | Ashrafi et al. |
| 2017/0093693 A1 | 3/2017 | Barzegar et al. |
| 2017/0222334 A1 | 8/2017 | Shtrom et al. |
| 2017/0318589 A1 | 11/2017 | Negus |
| 2018/0090830 A1 | 3/2018 | McMichael et al. |
| 2018/0331720 A1 | 11/2018 | Adriazola et al. |
| 2019/0103665 A1 | 4/2019 | Yoo et al. |
| 2019/0181926 A1 | 6/2019 | Liang et al. |
| 2019/0348759 A1 | 11/2019 | Walker et al. |
| 2019/0379427 A1 | 12/2019 | Geekie et al. |
| 2019/0392694 A1 | 12/2019 | Funaki et al. |
| 2021/0078296 A1* | 3/2021 | Kong .................. H01L 23/481 |
| 2021/0159608 A1 | 5/2021 | Verd et al. |
| 2021/0167811 A1 | 6/2021 | Henry et al. |
| 2022/0375865 A1* | 11/2022 | Pietambaram ...... H01L 23/5384 |
| 2023/0197618 A1* | 6/2023 | Kamgaing .......... H01L 23/5383 |
| | | 257/700 |

OTHER PUBLICATIONS

Rousstia et al., "Switched-beam array of dielectric rod antenna with RF-MEMS switch for millimeter-wave applications", Radio Sci., 2015, 50, 177-190.

Black et al., "Breaking Down mmWave Barriers with Holographic Beam Forming", MW Journal, Feb. 2020, vol. 63, No. 2.

Rein, Steve. "Waveguide Primer." Microwaves101, everythingRF, p. 1-7, Accessed Jan. 12, 2022. https://www.microwaves101.com/encyclopedias/waveguide-primer.

Chu, Qing-Xin, Ding-Liang Wen, and Yu Luo. "A broadband dual-polarized antenna with Y-shaped feeding lines." IEEE Transactions on Antennas and Propagation 63.2 (2015): 483-490.

* cited by examiner

3D GLASS MODULES

CROSS-REFERENCES TO RELATED APPLICATIONS

This application is a continuation-in-part and claims benefit of U.S. application Ser. No. 18/337,725 filed Jun. 20, 2023, which is a non-provisional and claims benefit of U.S. Patent Application No. 63/353,720 filed Jun. 20, 2022, the specifications of which are incorporated herein in their entirety by reference.

BACKGROUND OF THE INVENTION

A multilayer circuit board can have a multitude of uses, including as a transceiver for radiofrequency and wireless communication, wireless telecom (5G and beyond), space & satcom, medical devices, and radar. However, prior printed circuit board (PCB) or ceramic-based modules suffer from issues with use specificity, board complexity, feature size limitation, and higher-level integration becomes lossy. Thus, there exists a present need for a multilayer circuit board that is capable of reusable functionality, reduced board complexity, minimized size, and system-on-a-chip integration.

FIELD OF THE INVENTION

The present invention is directed to a scalable and cost-efficient multilayer glass module for a plurality of applications including photonics, electronics, memory, processors and wireless communication.

BRIEF SUMMARY OF THE INVENTION

It is an objective of the present invention to provide devices that allow for a scalable and cost-efficient multilayer glass module for wireless communication purposes, as specified in the independent claims. Embodiments of the invention are given in the dependent claims. Embodiments of the present invention can be freely combined with each other if they are not mutually exclusive.

In some embodiments, the present invention features a three-dimensional glass module. In some embodiments, the module may comprise a plurality of glass substrates comprising a first glass substrate, a second glass substrate bonded to the first glass substrate, comprising passive and/or one or more electronic components, and a third glass substrate bonded to the second glass substrate or a ceramic or board.

One of the unique and inventive technical features of the present invention is the implementation of a three-dimensional glass module comprising a plurality of electronics disposed therein. Without wishing to limit the invention to any theory or mechanism, it is believed that the technical feature of the present invention advantageously provides for high frequency communications over 100 GHz with low loss. None of the presently known prior references or work has the unique inventive technical feature of the present invention.

Furthermore, the inventive technical features of the present invention contributed to a surprising result. One of ordinary skill in the art would expect that an electronic module comprising stacked glass layers would be inefficient due to the brittleness of glass, the risk of overheating, accuracy issues, low production yield, high costs, and the difficulties in getting metal to stick to glass layers. Surprisingly, the present invention implements a plurality of unique and inventive features listed below that allow for the three-dimensional glass modules of the present invention to be efficient, accurate, capable of high-frequency communication, and highly producible. Thus, the inventive technical feature of the present invention contributed to a surprising result.

Another one of the unique and inventive technical features of the present invention is the implementation of a plurality of glass layers, each layer comprising one or more holes filled with copper for bonding the glass layers to each other. Without wishing to limit the invention to any theory or mechanism, it is believed that the technical feature of the present invention advantageously provides for greater thermal transference throughout the plurality of glass layers, allowing electronics disposed therein to function without overheating. None of the presently known prior references or work has the unique inventive technical feature of the present invention.

Another one of the unique and inventive technical features of the present invention is the implementation of a plurality of glass layers containing electronics such that the electronics communicate across layers by radiofrequency (RF). Without wishing to limit the invention to any theory or mechanism, it is believed that the technical feature of the present invention advantageously provides for better accuracy and production yield since the glass layers no longer require alignment of the small electronic features for an electrical connection. None of the presently known prior references or work has the unique inventive technical feature of the present invention.

Another one of the unique and inventive technical features of the present invention is the implementation of a plurality of glass layers containing capacitors and inductors extending across multiple layers such that the capacitors and inductors can be coupled to electronic components on multiple layers. Without wishing to limit the invention to any theory or mechanism, it is believed that the technical feature of the present invention advantageously provides for efficient power distribution across the entirety of a three-dimensional glass module. None of the presently known prior references or work has the unique inventive technical feature of the present invention.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE SEVERAL VIEWS OF THE DRAWING(S)

The features and advantages of the present invention will become apparent from a consideration of the following detailed description presented in connection with the accompanying drawings in which.

DETAILED DESCRIPTION OF THE INVENTION

Figure 2:
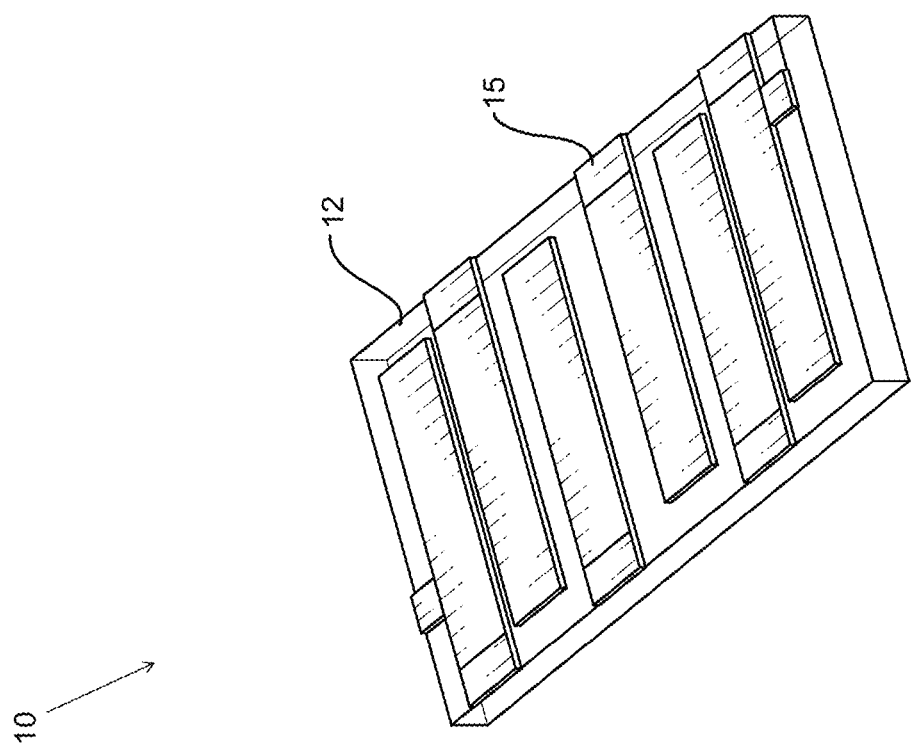
FIG. 2 shows a diagram of a middle glass substrate of the module of the present invention.
Figure 1:
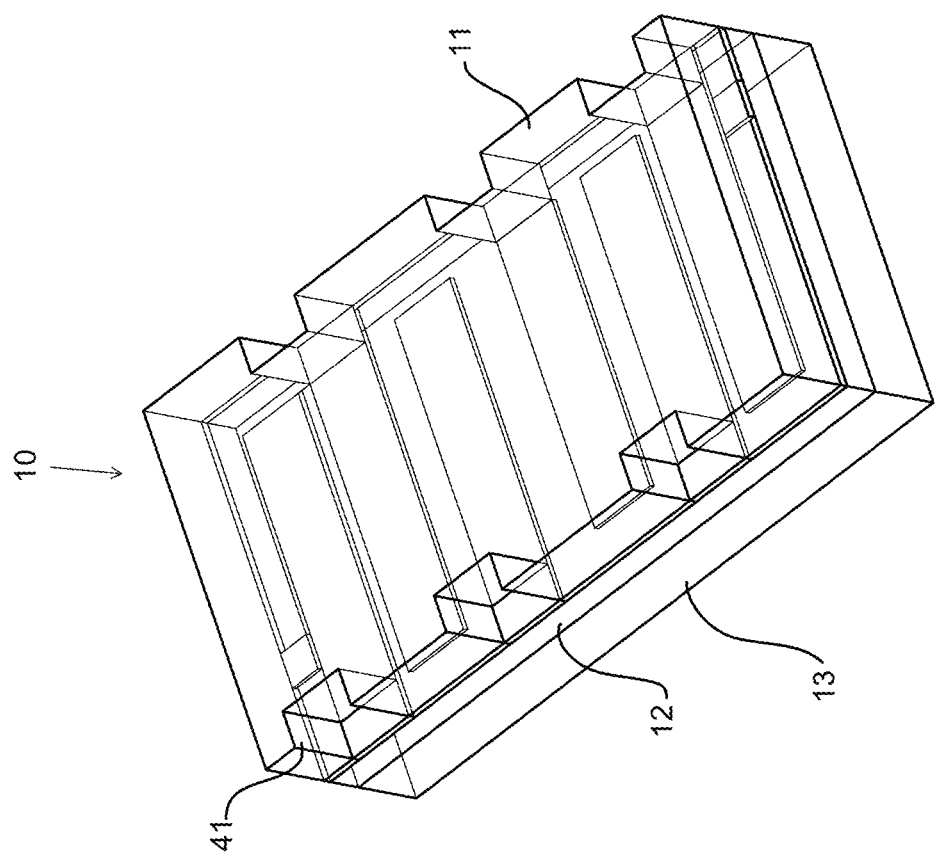
FIG. 1 shows a diagram of the three-dimensional glass module of the present invention.
Figure 3B:
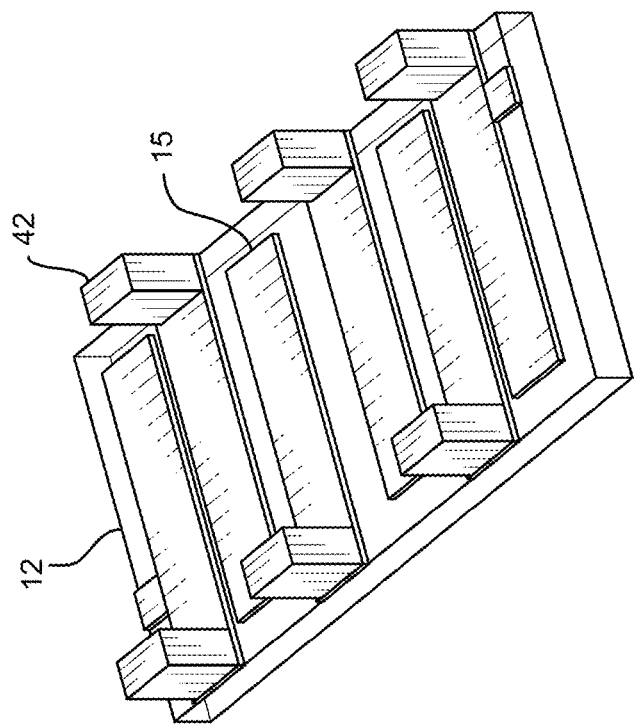
FIG. 3B shows a diagram of a middle glass substrate of the module of the present invention comprising a plurality of pegs configured to fit into the plurality of slots.
Figure 3A:
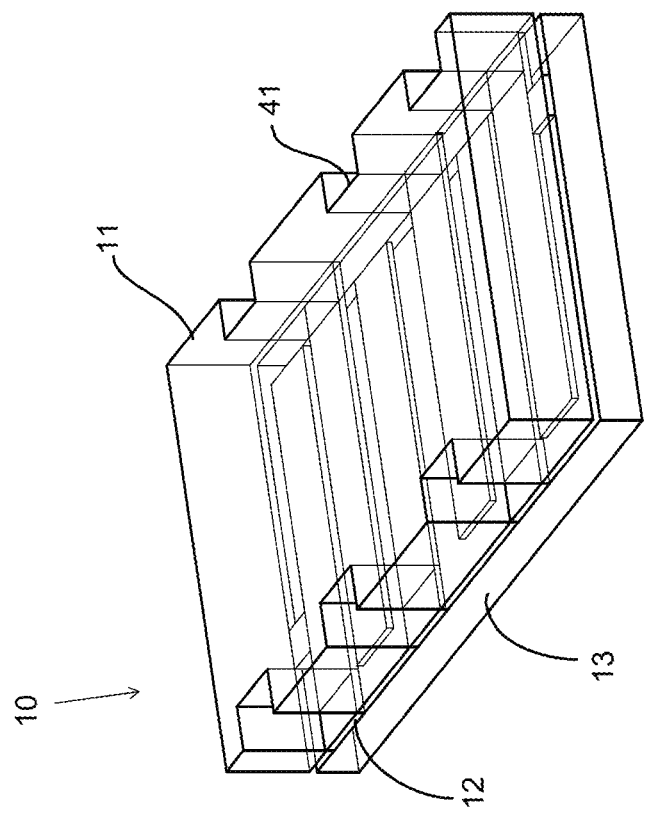
FIG. 3A shows a diagram of a top glass substrate of the module of the present invention comprising a plurality of slots.
Figure 3C:
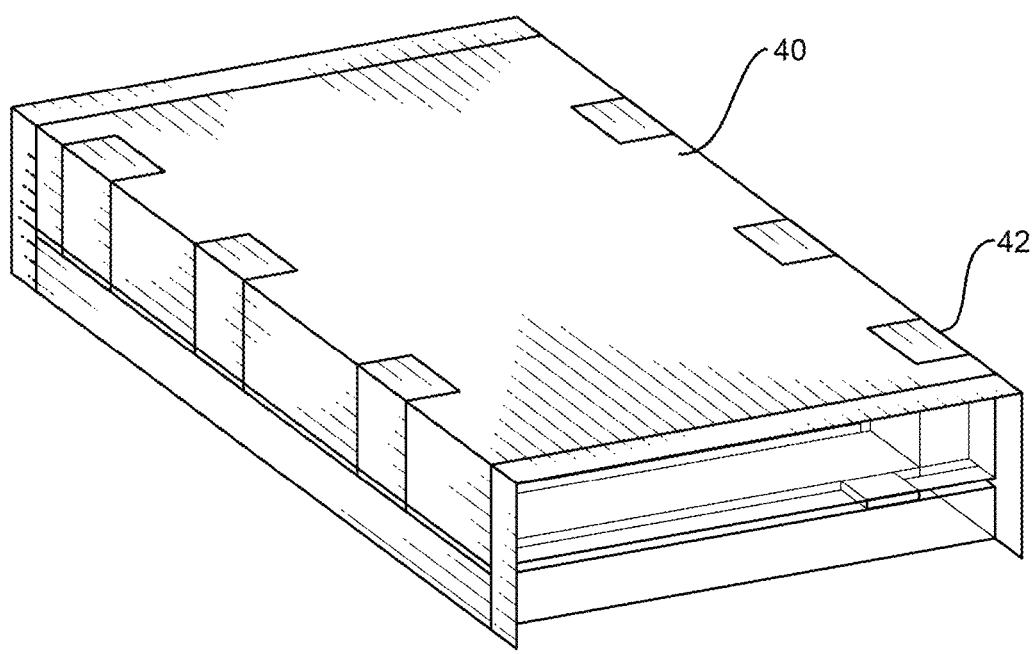
FIG. 3C shows a diagram of the module of the present invention comprising a lid such that the lid contacts the plurality of pegs.
Figure 4B:
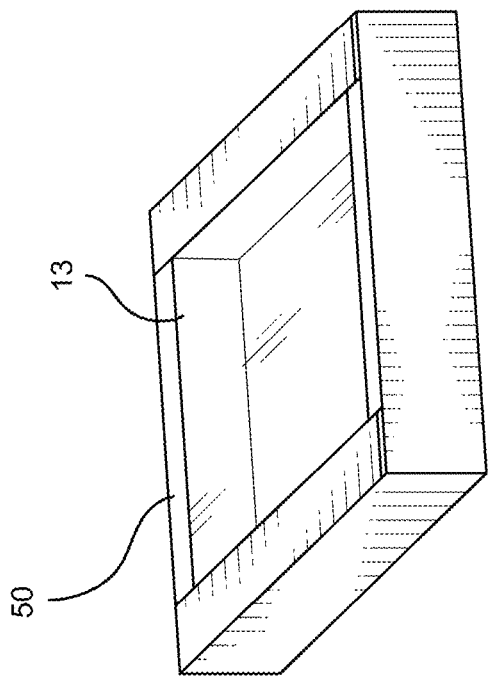
FIG. 4B shows an alternate embodiment of the foundation cavity of the present invention having the bottom glass substrate of the module disposed inside.
Figure 4A:
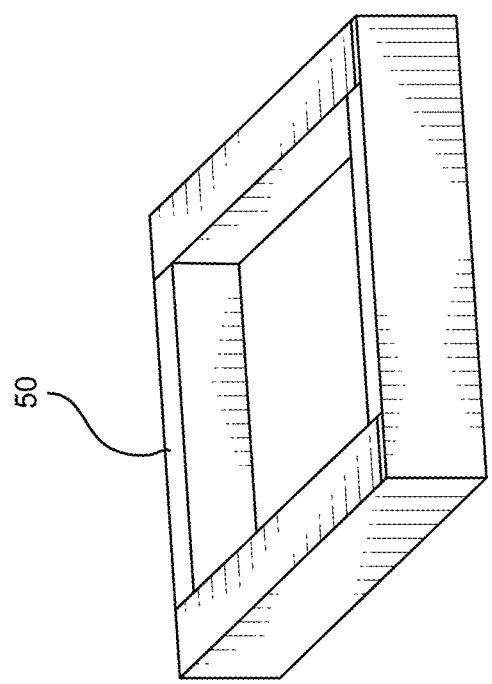
FIG. 4A shows an embodiment of a foundation cavity configured to fit the module of the present invention.
Figure 4C:
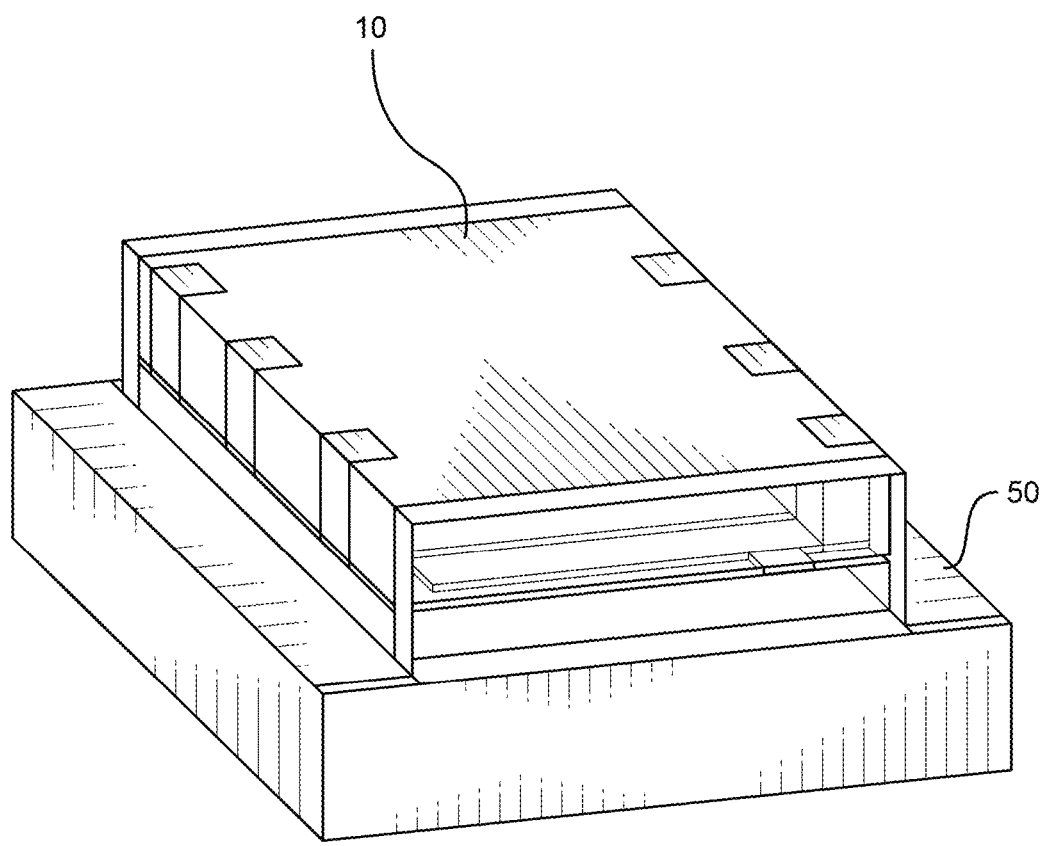
FIG. 4C shows the module of the present invention fitting into the foundation cavity.
Figure 5B:
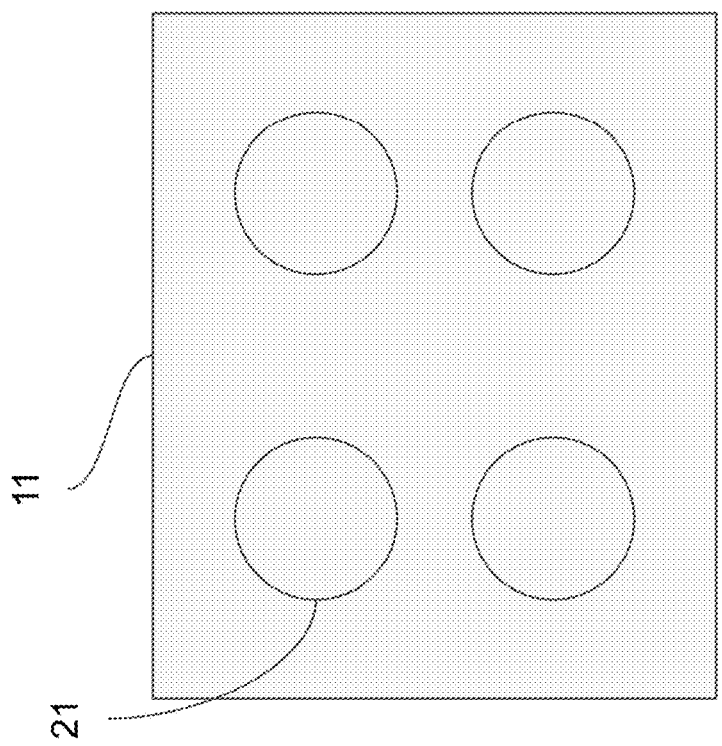
FIG. 5B shows a top view of the module of the present invention comprising a plurality of aligned holes in each layer.
Figure 5A:
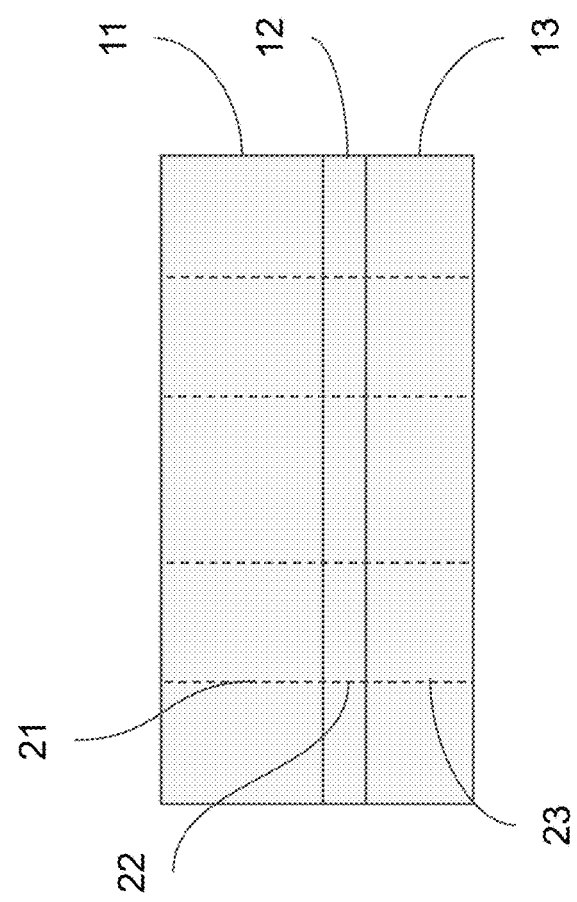
FIG. 5A shows a side view of the module of the present invention comprising a plurality of aligned holes in each layer.
Figure 6:
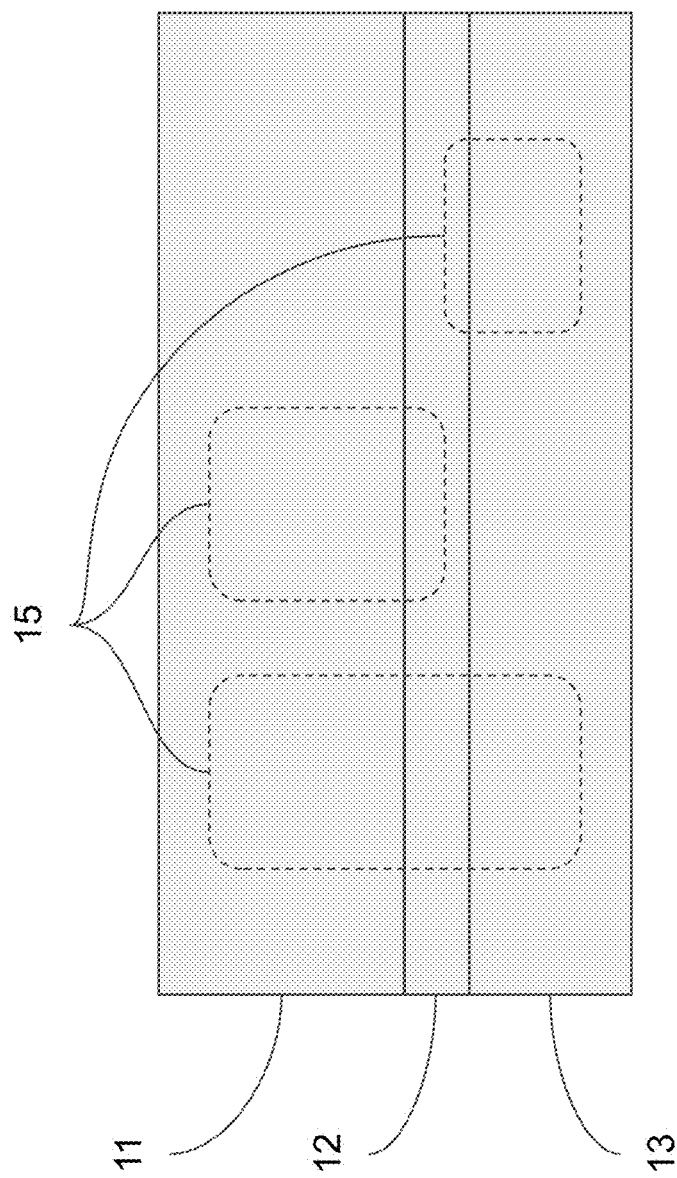
FIG. 6 shows an embodiment of the module of the present invention comprising capacitors and inductors configured to stretch across multiple layers of the module.
Figure 7:
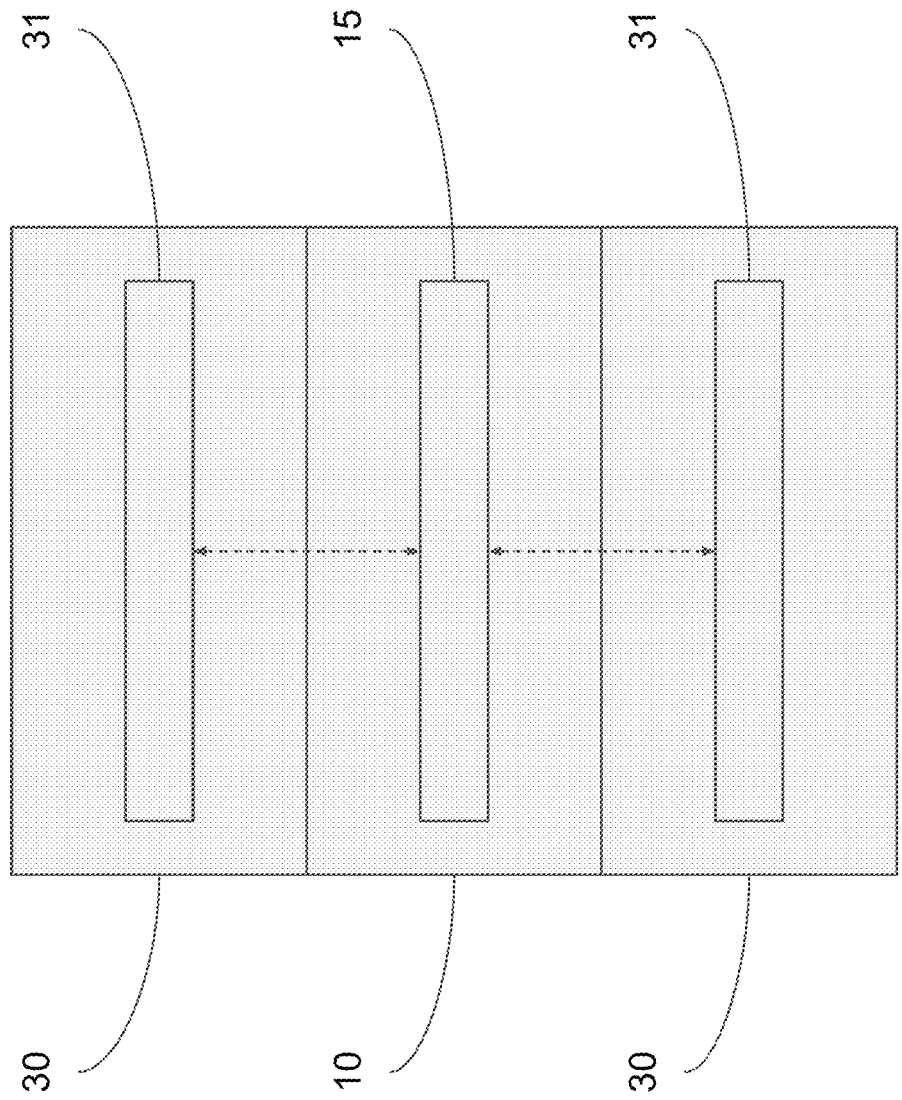
FIG. 7 shows an embodiment of the module of the present invention comprising a plurality of modules coupled to each other. The electronic components of each module communicate through radiofrequency (RF).

Following is a list of elements corresponding to a particular element referred to herein:
10 module
11 first glass substrate
12 second glass substrate
13 third glass substrate
15 electronic components
21 first substrate holes
22 second substrate holes
23 third substrate holes
30 additional glass substrates
31 additional electronic components
40 lid
41 slots
42 attachment component
50 carrier board
110 first layer
111 first substrate
112 first glass wall
113 first gap
114 first set of capacitors
115 first set of inductors
120 second layer
121 second substrate
122 BAW resonator
123 SAW resonator
124 glass layer
125 second set of capacitors
126 second set of inductors
127 diplexers
128 waveguides
130 third layer
131 third substrate
132 second glass wall
133 second gap
134 microchips
135 third set of capacitors
140 fourth layer
141 fourth substrate
142 glass cover layer
143 antennas
200 solder balls Referring now to FIG. 1, the present invention features a three-dimensional glass module (10). In some embodiments, the module (10) may comprise a plurality of glass substrates comprising a first glass substrate (11), a second glass substrate (12) bonded to the first glass substrate (11) by a first redistribution layer, comprising one or more electronic components (15), and a third glass substrate (13) bonded to the second glass substrate (12) by a second redistribution layer. In some embodiments, the plurality of glass substrates may comprise more than three substrate layers, configured to be bonded together by redistribution layers, at least one of which comprising the one or more electronic components (15). In some embodiments, the plurality of glass substrates may comprise two substrate layers, configured to be bonded together by a redistribution layer, at least one of which comprising the one or more electronic components (15).

In some embodiments, the glass material of the plurality of glass substrates may comprise annealed glass, heat-strengthened glass, tempered glass, laminated glass, or a combination thereof. In some embodiments, the redistribution layers may comprise conductive layers, a plurality of conductive wires, or a combination thereof. The conductive layer/conductive wires of the redistribution layers may comprise silver, copper, gold, or any conductive material.

In some embodiments, the first glass substrate (11) may comprise one or more holes (21). In some embodiments, the second glass substrate (12) may comprise one or more holes (22). In some embodiments, the third glass substrate (13) may comprise one or more holes (23). In some embodiments, the one or more holes (21) of the first glass substrate (11), the one or more holes (22) of the second glass substrate (12), and the one or more holes (23) of the third glass substrate (13) may align and may be filled with a conductive material. In some embodiments, only the one or more holes (21) of the first glass substrate (11) and the one or more holes (22) of the second glass substrate (12) may align. In some embodiments, only the one or more holes (22) of the second glass substrate (12) and the one or more holes (23) of the third glass substrate (13) may align. In some embodiments, none of the holes of any glass substrate layer are aligned.

In some embodiments, the holes filled with conductive material may be configured to prevent the module (10) from overheating by distributing heat evenly between layers. In some embodiments, the conductive material may comprise copper, silver, gold, or any other conductive material capable of distributing thermal energy evenly.

In some embodiments, the one or more electronic components (15) may comprise a capacitor, an inductor, or a combination thereof. In some embodiments, the one or more electronic components (15) may comprise one or more capacitors, inductors, diplexers, antennas, filters, processors, memory components, resistors, transistors, light-emitting diodes, integrated circuits, switches, fuses, transformers, wires, cables, batteries, relays, motors, or a combination thereof. In some embodiments, the capacitor, the inductor, or the combination thereof may be disposed within two or more glass substrates of the plurality of glass substrates.

In some embodiments, the first glass substrate (11), the third glass substrate (13), or a combination thereof may be configured to attach to one or more additional glass modules (30). In some embodiments, each additional glass module of the one or more additional glass modules (30) may comprise one or more additional electronic components (31). In some embodiments, the one or more additional glass modules (30) may be configured to attach to each other. In some embodiments, the one or more additional glass modules (30) the glass module (10), or a combination thereof may comprise one or more attachment components configured to attach one glass module to another. In some embodiments, the one or more attachment components may comprise adhesives, brackets, polymers, or a combination thereof.

In some embodiments, the one or more electronic components (15) of the module (10) may be configured to communicate with the one or more additional electronic components (31) through radiofrequency (RF) communication. In some embodiments, the one or more electronic components (15) of the module (10) may be configured to communicate with the one or more additional electronic components (31) through a Bluetooth® connection. In some embodiments, the one or more electronic components (15) of the module (10) may be configured to communicate with the one or more additional electronic components (31) through any wireless connection. In some embodiments, this may allow for multiple attached modules to communicate with each other without the small electronic components needing to be aligned. In some embodiments, the one or more electronic components (15) may comprise one or more wireless transceivers. In some embodiments, the one or more additional electronic components (31) may comprise one or more wireless transceivers.

In some embodiments, the first glass substrate (11) may comprise one or more slots (41) configured to expose the one or more electronic components (15). In some embodiments, the module (10) may further comprise a lid (40) configured to fit over the first glass substrate (11), comprising one or more attachment components (42) configured to fit into the one or more slots (41). In some embodiments, a material of the lid (40) may comprise metal.

In some embodiments, the module (10) of the present invention may be configured to fit into a carrier board (50). In some embodiments, the carrier board (50) may comprise a cavity. In some embodiments, the third substrate (13) may be shaped such that it fits snugly into the cavity. In some embodiments, the plurality of glass substrates may be shaped such that they fit snugly into the cavity.

In some embodiments, the module (10) may be 0.5 to 3 cm in length. In some embodiments, the module (10) may be 0.5 to 3 cm in width. In some embodiments, the module (10) may be 0.5 to 3 cm in height.

In some embodiments, the module (10) may comprise a cube shape. In some embodiments, the module (10) may comprise a rectangular prism shape. In some embodiments, the module (10) may comprise any three-dimensional shape having one or more faces configured to attach to the one or more faces of other instances of the module (10).

Figure 8:
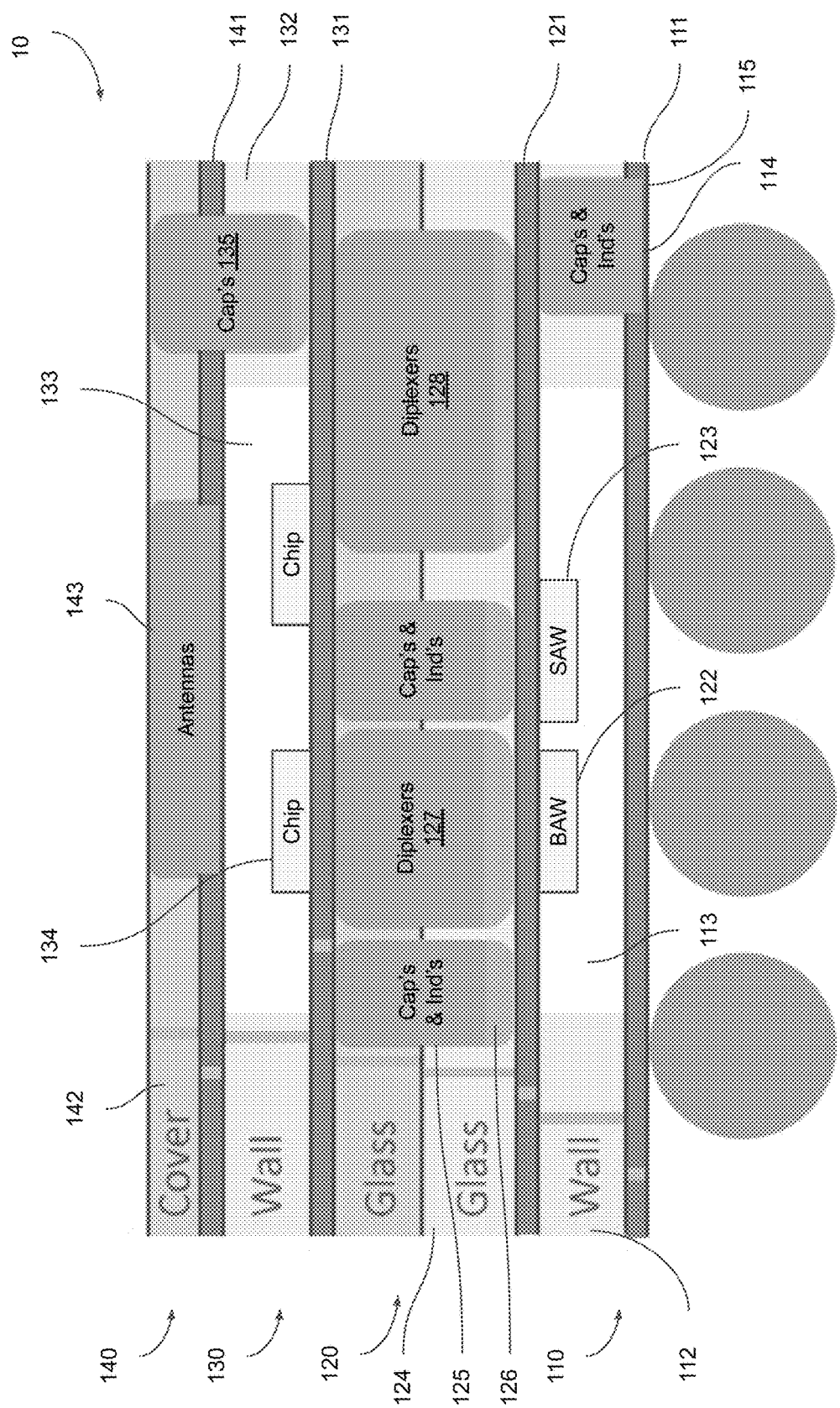
FIG. 8 shows an example of the present invention comprising a communication module.

Referring now to FIG. 8, a communication module example of the present invention features a multilayer hermetic glass module (10) for wireless communication. In some embodiments, the module (10) may comprise a plurality of glass layers each separated by a substrate of a plurality of substrates and connected by a redistribution layer (RDL) of a plurality of RDLs. One or more electronic components may be disposed within the plurality of glass layers. In some embodiments, the one or more electronic components may be selected from a group consisting of capacitors (114, 125, 135), inductors (115, 126), resonators (122, 123), microchips (134), antennas (143), diplexers (127), and waveguides (128). In some embodiments, the antennas (143) may be incorporated into a cover placed over one or more of the plurality of glass layers and connect to the one or more electronic components through one or more vias.

In some embodiments, the resonators (122, 123) may comprise a bulk acoustic wave (BAW) resonator (122), a surface acoustic wave (SAW) resonator (123), or a combination thereof. In some embodiments, the antennas (143) comprise a Wifi antenna, a long-range (LoRa) antenna, a wide-area network (WAN) antenna, a low-power wide-area network (LPWAN) antenna, or a combination thereof. In some embodiments, the capacitors may comprise fixed capacitors, variable capacitors, or a combination thereof. In some embodiments, the inductors may comprise air-core inductors, ferromagnetic-core inductors, variable inductors, chokes, or a combination thereof. In some embodiments, the microchips (134) may comprise logic chips, memory chips, application-specific integrated chips (ASICs), or a combination thereof. In some embodiments, each substrate of the plurality of substrates may comprise copper, alumina, Polytetrafluoroethylene (PTFE), Kapton, or a combination thereof. In some embodiments, the module (10) may comprise one or more solder balls (200) disposed on a bottom surface of the first substrate (110).

According to other embodiments, the present invention features a hermetic glass module (10) for wireless communication. In some embodiments, the module (10) may comprise a plurality of glass layers. The plurality of glass layers may comprise a first layer (110) comprising a first set of one or more capacitors (114), a first set of one or more inductors (115), and a set of one or more resonators (122, 123). The plurality of glass layers may further comprise a second layer (120) comprising a second set of one or more capacitors (125), a second set of one or more inductors (126), a set of one or more diplexers (127), and a set of one or more waveguides (128). The plurality of glass layers may further comprise a third layer (130) comprising a set of one or more microchips (134), and a third set of one or more capacitors (135). The plurality of glass layers may further comprise a fourth layer (140) comprising a glass cover layer (142), and one or more antennas (143) disposed within the glass cover layer (142). The plurality of glass layers may each be separated by a substrate of a plurality of substrates and are connected by a redistribution layer (RDL) of a plurality of RDLs.

According to some other embodiments, the present invention features a hermetic glass module (10) for wireless communication. In some embodiments, the module (10) may further comprise a first layer (110) comprising a first substrate (111), a first glass wall (112) disposed around a perimeter of the substrate, the first glass wall (112) encompassing a first gap (113), a first set of one or more capacitors (114) disposed within the first glass wall (112), and a first set of one or more inductors (115) disposed within the glass wall. In some embodiments, the module may further comprise a second layer (120) coupled to the first layer (110) by a redistribution layer (RDL). The second layer (120) may comprise a second substrate (121) disposed on top of the glass wall of the first layer (110), a bulk acoustic wave (BAW) resonator (122) disposed on a bottom surface of the second substrate (121) such that the BAW resonator (122) is disposed in the first gap (113), a surface acoustic wave (SAW) resonator (123) disposed on a bottom surface of the second substrate (121) such that the SAW resonator (123) is disposed in the first gap (113), and a glass layer (124) disposed on top of the second substrate (121. The glass layer (124) may be divided horizontally into a first sublayer and a second sublayer. The second layer (120) may further comprise a second set of one or more capacitors (125) disposed within the glass layer (124), a second set of one or more inductors (126) disposed within the glass layer (124), one or more diplexers (127) disposed within the glass layer (124), and one or more waveguides (128) disposed within the glass layer (124).

The module (10) may further comprise a third layer (130) coupled to the second layer (120) by a RDL. The third layer may comprise a third substrate (131) disposed on top of the glass layer (124), a second glass wall (132) disposed around a perimeter of the third substrate (131), the second glass wall (132) enclosing a second gap (133), one or more microchips (134) disposed on a top surface of the third substrate (131) such that the one or more microchips (134) are disposed within the second gap (133), and a third set of one or more capacitors (135) disposed within the second glass wall (132). The module (10) may further comprise a fourth layer (140) coupled to the third layer (130) by a RDL. The fourth layer (140) may comprise a fourth substrate (141) disposed on top of the second glass wall (132), a glass cover layer (142) disposed on top of the fourth substrate (141), and one or more antennas (143) disposed within the glass cover layer (142). In some embodiments, the module (10) may further comprise one or more solder balls (200) disposed on a bottom surface of the first substrate (110).

In some embodiments, a redistribution layer (RDL) may comprise a layer of wiring interconnects that are fabricated onto a substrate layer to allow for improved bonding between substrate layers as well as a redistribution of I/O access to different parts of the chip layer. This has previously not been implemented in a multilayer hermetic glass module for wireless communication.

In some embodiments, the present invention may implement RF coupling from layer to layer to avoid alignment issues between adjacent glass cores and provide an electrical interface without the use of connectors. In some embodiments, the present invention may implement the placement of high-density copper vias to spread and improve heat transfer throughout the glass. In some embodiments, the present invention may implement vias extending through glass layers to adjacent glass layers to provide a dual path of heat spreading to the bottom and the top. In some embodiments, the present invention may be configured to increase the load of a passive circuit by stacking bonded or non-bonded structures. In some embodiments, the present invention may implement high-frequency capacitance by providing metal-to-metal coupling between pads between two or more glass cores. In some embodiments, the present invention may implement an anti-tampered embedded fuze in one or more glass layers. In some embodiments, the present invention may implement a 3D capacitor coupled to the top of the glass module and embedded using copper vias. In some embodiments, the present invention may implement a combination of a glass pocket and thermal compression bond allowing for a hermetic package. In some embodiments, the present invention eliminates the interposer layer by adding redistribution layers on top of the glass electronic layer.

The present invention features three-dimensional glass packaging for electronics, including telecommunications, military applications (i.e. radar, lidar, positioning, etc.), and/or wireless communication. In some embodiments, the module of the present invention can be used for any general electronic device. The module of the present invention may also be a component (e.g. a waveguide filter), a multichip device (e.g. phase array, phase-locked loop), or just a packaging solution (e.g. simply a single chip on a carrier).

In some embodiments, the first glass substrate (11) may comprise one or more slots (41) configured to expose at least a portion of the one or more electronic components (15) and one or more lateral vias disposed in the one or more slots, such that the one or more electronic components (15) are accessible from a side or a top of the first glass substrate (11) through the one or more lateral vias. In some embodiments, the third glass substrate (13) may be configured to fit into a mountable carrier substrate. In some embodiments, the carrier substrate may comprise ceramic, organic material, or a combination thereof.

The term "processor" encompasses all kinds of apparatus, devices, and machines for processing data, including by way of example a programmable microprocessor, a microcontroller comprising a microprocessor and a memory component, an embedded processor, a digital signal processor, a media processor, a computer, a system on a chip, or multiple ones, or combinations, of the foregoing. The apparatus can include special-purpose logic circuitry, e.g., an FPGA (field programmable gate array) or an ASIC (application-specific integrated circuit). Logic circuitry may comprise multiplexers, registers, arithmetic logic units (ALUs), computer memory, look-up tables, flip-flops (FF), wires, input blocks, output blocks, read-only memory, randomly accessible memory, electronically-erasable programmable read-only memory, flash memory, discrete gate or transistor logic, discrete hardware components, or any combination thereof. The apparatus also can include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures. The processor may include one or more processors of any type, such as central processing units (CPUs), graphics processing units (GPUs), special-purpose signal or image processors, field-programmable gate arrays (FPGAs), tensor processing units (TPUs), and so forth.

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting essentially of" or "consisting of", and as such the written description requirement for claiming one or more embodiments of the present invention using the phrase "consisting essentially of" or "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed is:

1. A three-dimensional glass module (10) comprising: a. a plurality of glass substrates comprising: i. a first glass substrate (11); ii. a second glass substrate (12) bonded to the first glass substrate (11) by a first redistribution layer, comprising one or more electronic components (15); and iii. a third glass substrate (13) bonded to the second glass substrate (12) by a second redistribution layer; wherein the first glass substrate (11) comprises one or more slots (41) configured to expose at least a portion of the one or more electronic components (15) and one or more lateral vias disposed in the one or more slots, such that the one or more electronic components (15) are accessible from a side or a top of the first glass substrate (11) through the one or more lateral vias; and wherein the third glass substrate (13) is configured to fit into a mountable carrier substrate.

2. The module (10) of claim 1, wherein the first glass substrate (11) comprises one or more holes (21), wherein the second glass substrate (12) comprises one or more holes (22), wherein the third glass substrate (13) comprises one or more holes (23), wherein the one or more holes (21) of the first glass substrate (11), the one or more holes (22) of the second glass substrate (12), and the one or more holes (23) of the third glass substrate (13) align and are filled with a conductive material.

3. The module (10) of claim 2, wherein the conductive material comprises copper.

4. The module (10) of claim 1, wherein the one or more electronic components (15) comprise a capacitor, an inductor, or a combination thereof.

5. The module (10) of claim 4, wherein the capacitor, the inductor, or the combination thereof are disposed within two or more glass substrates of the plurality of glass substrates.

6. The module (10) of claim 1, wherein the first glass substrate (11), the third glass substrate (13), or a combination thereof are configured to attach to one or more additional glass modules (30), each additional glass module of the one or more additional glass modules (30) comprising one or more additional electronic components (31).

7. The module (10) of claim 6, wherein the one or more electronic components (15) of the module (10) are configured to communicate with the one or more additional electronic components (31) through radiofrequency (RF) communication.

8. The module (10) of claim 1, wherein the carrier substrate comprises ceramic, organic material, or a combination thereof.

9. A three-dimensional glass module (10) comprising: a. a plurality of glass substrates comprising: i. a first glass substrate (11) comprising one or more holes (21); ii. a second glass substrate (12) bonded to the first glass substrate (11) by a first redistribution layer, comprising one or more electronic components (15) and one or more holes (22); and iii. a third glass substrate (13) bonded to the second glass substrate (12) by a second redistribution layer, comprising one or more holes (23); wherein the one or more holes (21) of the first glass substrate (11), the one or more holes (22) of the second glass substrate (12), and the one or more holes (23) of the third glass substrate (13) align and are filled with a conductive material; wherein the first glass substrate (11) comprises one or more slots (41) configured to expose at least a portion of the one or more electronic components (15) and one or more lateral vias disposed in the one or more slots, such that the one or more electronic components (15) are accessible from a side or a top of the first glass substrate (11) through the one or more lateral vias; and wherein the third glass substrate (13) is configured to fit into a mountable carrier substrate.

10. The module (10) of claim 9, wherein the one or more electronic components (15) comprise a capacitor, an inductor, or a combination thereof.

11. The module (10) of claim 10, wherein the capacitor, the inductor, or the combination thereof are disposed within two or more glass substrates of the plurality of glass substrates.

12. The module (10) of claim 9, wherein the first glass substrate (11), the third glass substrate (13), or a combination thereof are configured to attach to one or more additional glass modules (30), each additional glass module of the one or more additional glass modules (30) comprising one or more additional electronic components (31).

13. The module (10) of claim 12, wherein the one or more electronic components (15) of the module (10) are configured to communicate with the one or more additional electronic components (31) through radiofrequency (RF) communication.

14. A three-dimensional glass module (10) comprising: a. a plurality of glass substrates comprising: i. a first glass substrate (11) comprising one or more holes (21); ii. a second glass substrate (12) bonded to the first glass substrate (11) by a first redistribution layer, comprising one or more electronic components (15) comprising a capacitor, an inductor, or a combination thereof, and one or more holes (22); and iii. a third glass substrate (13) bonded to the second glass substrate (12) by a second redistribution layer, comprising one or more holes (23); wherein the one or more holes (21) of the first glass substrate (11), the one or more holes (22) of the second glass substrate (12), and the one or more holes (23) of the third glass substrate (13) align and are filled with a conductive material; wherein the capacitor, the inductor, or the combination thereof are disposed across two or more glass substrates of the plurality of glass substrates; wherein the first glass substrate (11), the third glass substrate (13), or a combination thereof are configured to attach to one or more additional glass modules (30), each additional glass module of the one or more additional glass modules (30) comprising one or more additional electronic components (31); wherein the one or more electronic components (15) of the module (10) are configured to communicate with the one or more additional electronic components (31) through radiofrequency (RF) communication; wherein the first glass substrate (11) comprises one or more slots (41) configured to expose at least a portion of the one or more electronic components (15) and one or more lateral vias disposed in the one or more slots, such that the one or more electronic components (15) are accessible from a side or a top of the first glass substrate (11) through the one or more lateral vias; and wherein the third glass substrate (13) is configured to fit into a mountable carrier substrate.

* * * * *